(12) United States Patent
Inatsune

(10) Patent No.: US 7,679,549 B2
(45) Date of Patent: Mar. 16, 2010

(54) WAVEFORM GENERATION METHOD, RADAR DEVICE, AND OSCILLATOR FOR RADAR DEVICE

(75) Inventor: Shigeho Inatsune, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/467,686

(22) Filed: May 18, 2009

(65) Prior Publication Data

US 2009/0224961 A1 Sep. 10, 2009

Related U.S. Application Data

(63) Continuation of application No. 10/572,964, filed as application No. PCT/JP2005/002911 on Feb. 23, 2005, now Pat. No. 7,548,195.

(30) Foreign Application Priority Data

Feb. 25, 2004 (JP) ............................. 2004-049586

(51) Int. Cl.
*G01S 7/282* (2006.01)

(52) U.S. Cl. .................. 342/200; 342/201; 342/202; 342/203; 342/175; 342/100

(58) Field of Classification Search ......... 342/200–204, 342/175, 195, 82–88, 98–100, 109–112, 342/115, 128, 129, 134, 135
See application file for complete search history.

(56) References Cited

U.S. PATENT DOCUMENTS

| 4,947,176 | A | 8/1990 | Inatsune et al. |
| 6,529,568 | B1 | 3/2003 | Richards et al. |
| 7,196,658 | B2 | 3/2007 | Inatsune |
| 7,345,619 | B2 | 3/2008 | Hunt |
| 7,548,195 | B2* | 6/2009 | Inatsune ................ 342/200 |
| 7,567,206 | B1* | 7/2009 | Schmidt et al. ........ 342/175 |
| 7,589,665 | B2* | 9/2009 | Heide et al. ............ 342/127 |
| 2005/0165567 | A1 | 7/2005 | Inatsune |
| 2007/0103354 | A1 | 5/2007 | Inatsune |

FOREIGN PATENT DOCUMENTS

| EP | 1533906 A1 | 5/2005 |
| EP | 1739841 A1 | 1/2007 |
| JP | 61-144930 | 7/1986 |
| JP | 134723/1990 | 11/1990 |
| JP | 03-088504 | 4/1991 |
| JP | 11-168325 | 6/1999 |
| JP | 2002-156447 | 5/2002 |
| WO | WO 2004019496 A1 | 3/2004 |
| WO | WO 2005081407 A1 | 9/2005 |

* cited by examiner

*Primary Examiner*—John B Sotomayor
(74) *Attorney, Agent, or Firm*—Oblon, Spivak, McClelland, Maier & Neustadt, L.L.P.

(57) ABSTRACT

It is possible to generate D/A conversion voltage in which an error generated by numeric irregularities of a D/A conversion element such as resistor constituting a D/A converter 11 is corrected. A waveform generation method characterized in that input data into a D/A converter 11 are provided to the D/A converter in order at a timing at which a voltage of a desired waveform which has D/A conversion data indicating a conversion amount of the input data obtained by varying the input data by a minimum conversion unit or a unit obtained by multiplying the minimum conversion unit by an integer, and which varies with time series, becomes substantially equal to a D/A-converted voltage, whereby the D/A-converted voltage is generated in accordance with the desired waveform.

5 Claims, 5 Drawing Sheets

| STORAGE DATA IN THE MICROCOMPUTER ||
|---|---|
| TIMING | DESIRED D/A INPUT DATA |
| t1 | 00 |
| t2 | 01 |
| t3 | 02 |
| t4 | 03 |
| t5 | 04 |
| t6 | 05 |
| t7 | 06 |
| t8 | 07 |
| t9 | 08 |
| t10 | 09 |
| t11 | 0A |
| t12 | 0B |
| ⋮ | ⋮ |
| t252 | FB |
| t253 | FC |
| t254 | FD |
| t255 | FE |
| t256 | FF |

WAVEFORM GENERATION METHOD, RADAR DEVICE, AND OSCILLATOR FOR RADAR DEVICE

CROSS-REFERENCE

This application is a continuation of U.S. Ser. No. 10/572,964, filed on Mar. 21, 2006, the entire contents of each which are incorporated herein by reference, which claims the benefit of priority under 35 U.S.C. §120 from PCT/JP05/02911, filed Feb. 23, 2005, all of which claim the benefit of priority under 35 U.S.C. §119 from Japanese Patent Application No. JP 2004-049586, filed Feb. 25, 2004.

TECHNICAL FIELD

This invention relates to a waveform generation method adapted to generate a waveform programmably, and a radar device provided with waveform generation means adapted to generate a waveform programmably.

BACKGROUND ART

In a conventional waveform generation method, output levels of a D/A converter are set at regular intervals, and a conversion timing is varied at a predetermined ratio, a desired signal is thereby obtained (for example, refer to the Patent Document 1).

In a conventional radar device, data obtained by correcting a linearity of an oscillating frequency of VCO occurring due to a non-linearity and the like of D/A converter, LPF, and VCO, which are provided between CPU and a voltage control oscillator (which will hereinafter be referred to as VCO), are provided to D/A converter at regular timing intervals (for example, refer to Patent Document 2).

Patent Document 1: JP-A-61-144930 (page 3, left lower column, FIG. 3)

Patent Document 2: JP-A-2002-156447 (page 4, left column to page 5, right column, FIG. 1, FIG. 6)

DISCLOSURE OF THE INVENTION

Problems that the Invention is to Solve

When data are provided to a plurality of input terminals of D/A converter in a conventional waveform generation method, a voltage value subjected to D/A conversion by each input terminal is supposed to be constant. Therefore, an error of a voltage value occurring in each input terminal due to numeric irregularities of a D/A conversion element, such as a resistor etc. constituting the D/A converter and to be D/A converted is not taken into consideration. This caused the accuracy of a waveform to be deteriorated.

When conversion data including data on a D/A converter are measured in conventional radar device, the data inputted into the D/A converter are different from a minimum conversion unit, and values among the measured data are generated by interpolation based on approximation. Therefore, errors of D/A conversion voltage values generated in each input terminal due to numeric irregularities of the D/A conversion element, such as a resistor, etc. are not taken into consideration, and, therefore, the accuracy of a generated waveform was deteriorated. Since the accuracy of the generated waveform is deteriorated, the accuracy of the oscillation frequency of VCO oscillated on the basis of the generated waveform is also deteriorated. Therefore, in radar device for measuring a distance between the radar device and an object on the basis of a frequency reflected on the object, or a relative velocity with respect to the object, the measuring accuracy of the radar device was deteriorated. In order to improve the measuring accuracy, it is necessary to employ an expensive D/A having an increased bit number to cause a price of the radar device to become high.

The present invention has been made so as to solve these problems, and provides a waveform generation method and radar device which are capable of improving the accuracy of a waveform to be generated, even when a D/A conversion element, such as a resistor, etc. had numeric irregularities.

Means for Solving the Problems

In the waveform generation method according to the present invention, a voltage D/A converted in accordance with a desired waveform is generated on the basis of the D/A conversion data obtained by varying input data into the D/A converter by a minimum conversion unit, or by a unit obtained by multiplying the minimum conversion unit by an integer.

In the radar device according to the present invention, a voltage D/A converted in accordance with a desired waveform is generated on the basis of the D/A conversion data obtained by varying input data into the D/A converter by a minimum conversion unit, or by a unit obtained by multiplying the minimum conversion unit by an integer, and the voltage is provided to the oscillating means to thereby vary the oscillation frequency.

ADVANTAGE OF THE INVENTION

The present invention becomes able to generate a voltage in which an error occurring due to a scatter of the numerical value of a D/A conversion element, such as a resistor constituting the D/A converter were corrected, by generating a D/A conversion voltage in accordance with a desired voltage on the basis of D/A conversion data obtained by varying input data into the D/A converter by a minimum conversion unit, or by a unit obtained by varying the minimum conversion unit by multiplying the minimum conversion unit by an integer.

BRIEF DESCRIPTION OF THE DRAWINGS

Figure 1:
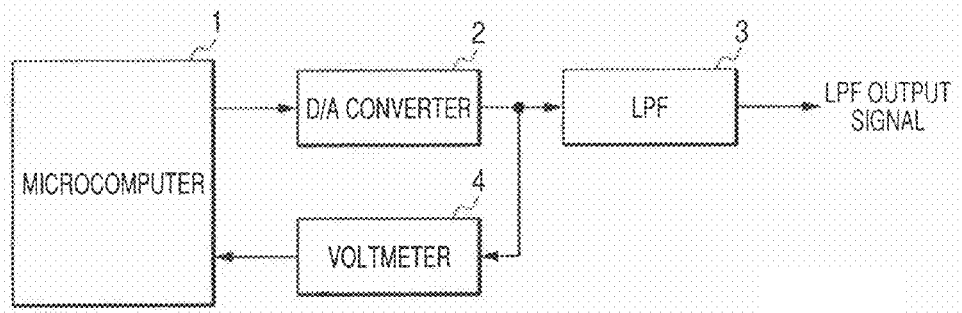
[FIG. 1] It is a block diagram of a waveform generation method showing an embodiment 1 of the present invention.

1 Microcomputer
2 D/A converter
3 LPF
4 Voltmeter
5 D/A conversion voltage signal
6 Desired waveform signal
7 Microcomputer
8 Voltmeter
9 IC tester
10 Microcomputer
11 VCO
12 Directional coupler
13 Transmission antenna
14 Mixer
15 Reception antenna
16 Amplifier
17 A/D converter
18 Transmission frequency
19 Reception frequency
20 Desired waveform signal

BEST MODE FOR CARRYING OUT THE INVENTION

Embodiment 1

FIG. 1 shows a block diagram of the waveform generation method in an embodiment 1 for carrying out this invention. In FIG. 1, the data (which will hereinafter be referred to as desired D/A input data) in accordance with a desired voltage waveform (which will hereinafter be referred to as desired waveform) stored in advance in a memory (not shown) contained in a microcomputer 1 are provided to a D/A converter 2, to generate a voltage (which will hereinafter be referred to as D/A conversion voltage) D/A converted in accordance with the desired waveform. This D/A conversion voltage is then passed through a low-pass filter LPF 3 to obtain a LPF output signal from which a high-frequency component occurring with the D/A conversion is eliminated.

When the desired D/A input data are generated, the microcomputer 1 gives data (which will hereinafter be referred to as measured D/A input data) obtained by increasing in order by a minimum conversion unit of the D/A converter 2, or by a unit obtained by multiplying the minimum conversion unit by an integer, to the D/A converter 2, and an actual D/A conversion voltage is measured with a voltmeter 4 as a voltage measuring means to obtain data (which will hereinafter be referred to as D/A conversion data) corresponding to the D/A conversion voltage with respect to each measured D/A input data. A desired D/A input data are then generated by extracting the measured D/A input data at a timing at which a voltage of a desired waveform varying with time series and the D/A conversion voltage in the D/A conversion data become equal to each other.

The method of generating desired D/A input data in this embodiment will now be described with reference to FIG. 2 to FIG. 4. In the following description, measured D/A input data mentioned above are used as a minimum conversion unit of the D/A converter 2. This can also be applied to a case where the measured D/A input data are used as a unit obtained by multiplying the minimum conversion unit by an integer.

First, the method of generating the D/A conversion data will be described with reference to FIG. 2. FIG. 2 is a waveform diagram showing an example of the generation of D/A conversion data generated in advance of the generation of the desired D/A input data. In FIG. 2, the lateral axis represents measured D/A input data provided to the D/A converter 2, and the longitudinal axis D/A conversion voltage measured with the voltmeter 4. The data are shown with the input bit number of 8 of the D/A converter 2. The measured D/A input data is 00(h) to FF(h) in hexadecimal notation, the D/A conversion voltage is 256 stages of V0 to V255.

The measured D/A input data are provided by the microcomputer 1 to the D/A converter 2 so that the data increase in order by one count from 00(h) to FF(h) to generate D/A conversion voltage signal 5. On each stage, a voltage of the D/A conversion voltage signal 5 is measured with the voltmeter 4 to obtain D/A conversion voltage V0 to V255.

The D/A converter 2 mentioned above generates an error of voltage to be D/A converted by each bit of an input terminal due to numeric irregularities of a D/A conversion element, such as a resistor etc. constituting the D/A converter 2. Therefore, the variation range of the D/A conversion voltage varying by each count of the D/A input data is measured as shown in FIG. 2 as the range varied in each count, or as the range varied periodically in accordance with the weight of each bit.

A method of forming desired D/A input data will be described with reference to FIG. 3 and FIG. 4. FIG. 3 is a waveform diagram showing an example of generation of desired D/A input data, and FIG. 4 is a drawing of storage data registered in the internal memory of the microcomputer 1. In FIG. 3, a lateral axis represents time, and a longitudinal axis represents a voltage. The longitudinal axis shows D/A conversion voltage V0 to V255 measured by the D/A conversion data generating method mentioned above. A timing t1 to t256 at which a desired waveform signal 6 shown with time series stored in advance in the internal memory in the microcomputer 1 crosses the D/A converted voltages V0 to V255 are shown on the lateral axis.

Figures 4, 5:
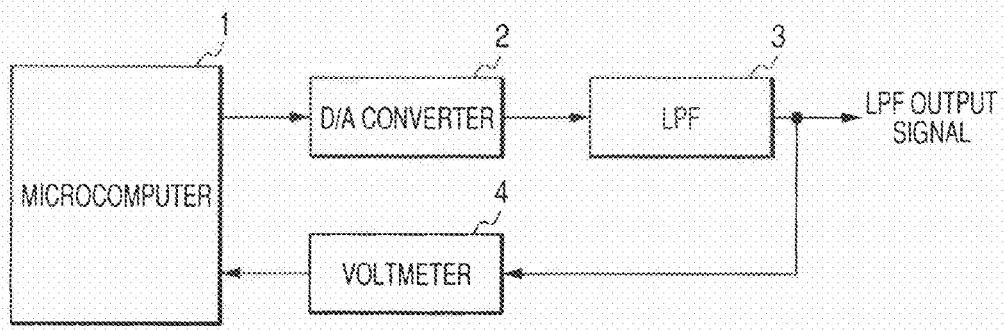
[FIG. 4] It is a drawing of storage data in which desired D/A input data showing the embodiment 1 of the present invention are stored in an internal memory of a microcomputer 1.
[FIG. 5] It is a block diagram of a waveform generation method showing an embodiment 2 of the present invention.

Each measured D/A input data at each timing of t1 to t256 can be obtained as desired D/A input data as shown in FIG. 4, by the above timing t1 to t256 and each measured D/A input data of 00(h) to FF(h) which generate each D/A conversion voltage of V0 to V255.

When the determination of the timing at which the desired waveform signal 6 crosses the D/A conversion voltage V0 to V255 is carried out in the microcomputer 1, a certain allowable value is provided with respect to each of the D/A conversion voltages, and a voltage value of the desired waveform stored in the internal memory is read in order in accordance with time series, a timing becomes able to be determined as the timing at which each of the D/A conversion voltages V0 to V255 is within the allowable value.

The voltmeter 4 was described as a part connected to the D/A converter 2 and the microcomputer 1. The voltmeter 4 may be provided so that the voltmeter 4 is released from the D/A converter 2 and microcomputer 1 after the D/A conversion voltage is measured during the generation of the desired D/A input data. The voltmeter 4 may be provided only when a D/A conversion voltage is measured, and may be removed from a product after the measurement is conducted.

The voltmeter 4 may also be made of an A/D converter.

The desired waveform signal 6 was shown as a signal increasing to a 256 stage of the D/A conversion voltage of V0 to V255 with time series. This signal may increase and decrease within the range in which the D/A converter 2 can convert the desired waveform signal 6. The number of bits of the D/A converter 2 may also be other than 8 bits at which the D/A conversion voltage is converted into 256 stages. An arbitrary D/A conversion voltage range may be set, for example, to a range having substantially equal to widths around V128 expressed as V128+−ΔV, or V100 to V200 etc.

The microcomputer 1 may be formed so as to generate desired D/A input data corresponding to a desired waveform, and gives the data to the D/A converter 2. All or some of these actions may be made as individual functional circuits.

Thus, according to this embodiment, it becomes possible to generate a D/A conversion voltage in which an error occurring due to numeric irregularities of the D/A conversion element such as a resistor constituting the D/A converter was corrected, by generating a D/A-converted voltage in accordance with the desired voltage on the basis of the D/A conversion data obtained by varying input data into the D/A converter 2 by a minimum conversion unit or by a unit obtained by multiplying the minimum conversion unit by an integer.

An example of the desired D/A input data outputted from the microcomputer 1 will now be described more in detail.

The microcomputer 1 outputs an input value (which will hereinafter be referred to as DAC input value), which designates D/A conversion voltage as desired D/A input data, into the D/A converter 2. The microcomputer 1 may store the timing (at which the D/A-converted voltage in the D/A conversion data and a voltage of a desired waveform varying with time series become substantially equal to each other) shown in FIG. 4 in the internal memory of the microcomputer 1.

Figure 2:
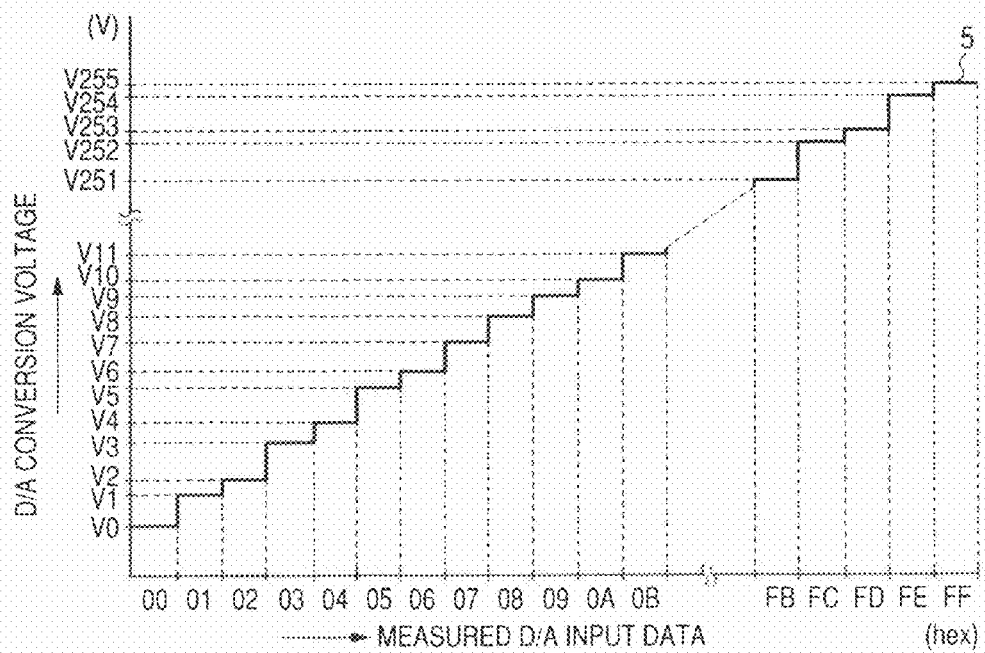
[FIG. 2] It is a waveform diagram describing an example of the generation of D/A conversion data showing the embodiment 1 of the present invention.
Figure 3:
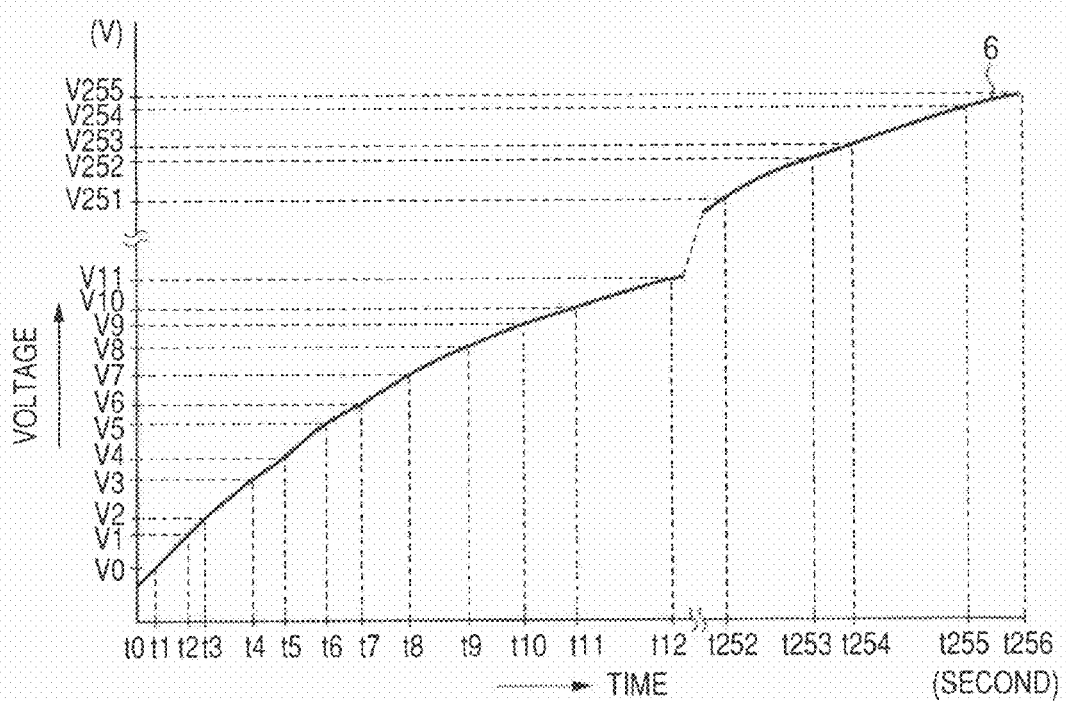
[FIG. 3] It is a waveform diagram showing an example of the generation of desired D/A input data shown in the embodiment 1 of the present invention.

For example, the voltage V0 shown in FIG. 2 is provided to the DAC input value 00, while the voltage V255 is provided to the DAC input value FF. The microcomputer 1 stores (the timing t0 corresponding to the DAC input value 00 is a timing 0) the timing t1 to t256 at which the DAC input values 01 (corresponding to the voltage V1) to FF (corresponding to the voltage V255) are inputted into the D/A converter 2 correspondingly to each of the DAC input value. The microcomputer 1 outputs the DAC input value to the D/A converter 2 in accordance with the stored data.

The D/A 2 outputs an analog signal providing a voltage corresponding to the DAC input value. For example, a voltage corresponding to the voltage V0 is outputted with respect to the DAC input value 00, and a voltage corresponding to the voltage V255 is outputted with respect to the DAC input value FF.

As the DAC input values, an initial value, the width of intervals of increment (or decrement) DAC input values and the number of increment (or decrement) are designated, and the DAC input value may be outputted at the corresponding timing.

For example, when as initial values, DAC input value is k, the width of intervals is 2 and frequency of occurrence of increment is n, a DAC input value k is outputted at a timing tk(=0), a DAC input value k+2 at the timing tk+2, a DAC input value k+4 at a timing tk+4, . . . DAC input value k+2n at a timing tk+2n and so forth.

In another embodiment the microcomputer 1 may store different values for different temperatures correspondingly to desired D/A input data, and a timing for outputting a DAC input value may be computed at a predetermined temperature T.

For example, as the timing at which the DAC input value corresponds to the voltage Vk, the timing tk(T1) at which the temperature is T1 and the timing tk(T2) at which the temperature is T2 are obtained from the internal memory of the microcomputer 1. When tk−1(T1)=tk−1(T2) is set at the voltage of Vk−1, the timing tk(T) for outputting the output voltage Vk at the temperature T is expressed by the equation (1).

$$tk(T)=(m2/m)\cdot tk(T1)+(m1/m)\cdot tk(T2) \quad (1)$$

wherein m=m1+m2; m1=T1−T and m2=T−T2.

The timing for outputting the DAC input value at the temperature of T corresponding to each voltage value may be determined in the same manner in order.

The microcomputer 1 outputs to the D/A converter 2 the D/A input value which is calculated on the basis of the timing of prescribed temperature in order the DA input value corresponding to the desired D/A input data.

Embodiment 2

FIG. 5 shows a block diagram of the waveform generation method in the embodiment 2 for carrying out this invention. In the above-described embodiment 1, the voltmeter 4 is connected to an output of the D/A converter 2. In this embodiment, the voltmeter 4 is connected to an output of LPF 3.

The operation of this embodiment is identical with that of the embodiment 1. It becomes possible to generate D/A conversion voltage in which the non-linearity and the like depending upon the voltage amplitude of the LPF 3 are corrected, in addition to the same effect of the embodiment 1 in which, owing to the voltmeter 4 connected to the output of the LPF 3, an error occurring due to numeric irregularities of the D/A conversion element, such as a resistor constituting the D/A converter 2 are corrected.

The voltmeter 4 was described as a part connected to the LPF 3 and micrometer 1. The voltmeter 4 may also be so provided that, after the D/A conversion voltage is measured during the generation of the desired D/A input data, the voltmeter 4 is released from the LPF 3 and microcomputer 1. The voltmeter 4 may be provided only when the D/A conversion voltage is measured, and, after the measurement finishes, the voltmeter may be removed from a product.

Embodiment 3

Figure 6:
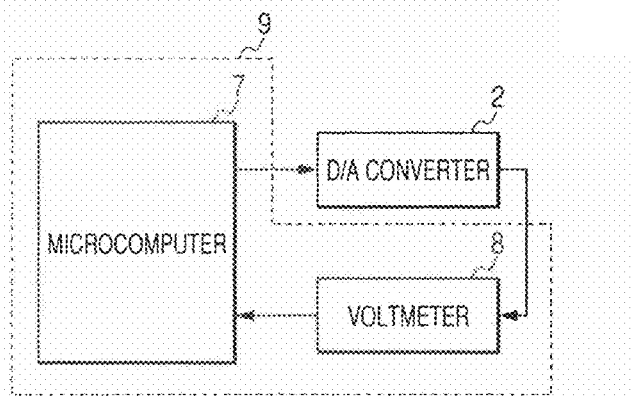
[FIG. 6] It is a block diagram of waveform generation method showing an embodiment 3 of the present invention.

FIG. 6 shows a block diagram of the waveform generation method in the embodiment 3 for carrying out this invention. In the above-described embodiment 1, the microcomputer 1 and D/A converter 2 are formed in one body. In the embodiment 3, a microcomputer 7 and a voltmeter 8 constitute an IC tester 9 so that the D/A conversion data of the D/A converter 2 are measured with the D/A converter 2 by itself.

The operation of this embodiment 3 is identical with that of the embodiment 1. The measured D/A conversion data are stored in advance in the internal memory of the microcomputer 1 and used in which the D/A converter 2 is incorporated separately in one body. Thus, when the D/A conversion data of the D/A converter 2 are measured with the D/A converter 2 itself in the IC tester 9, the data measurement can be conducted efficiently, so that a productivity can be improved.

Embodiment 4

Figure 7:
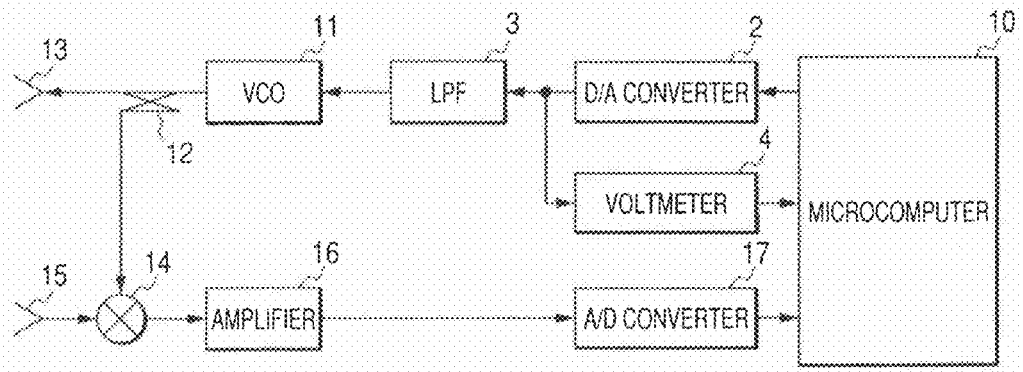
[FIG. 7] It is a block diagram of a FMCW radar device showing an embodiment 4 of the present invention.

FIG. 7 shows a block diagram of a FMCW radar device in the embodiment 4 for carrying out this invention. In FIG. 7, desired D/A data are provided to a D/A converter 2 in accordance with a desired waveform stored in a memory (not shown) contained in a microcomputer 10 in order, to generate D/A conversion voltage D/A-converted in accordance with the desired waveform. This D/A conversion voltage is passed through a low-pass filter LPF 3, and a LPF output signal with a high-frequency component, which occurs during the D/A conversion operation, removed is obtained. When this LPF output signal is provided to a voltage control oscillator (which will hereinafter be referred to as VCO) 11 as an oscillating means, a high-frequency signal varying an oscillating frequency in accordance with the desired waveform is generated. This high-frequency signal is distributed by a directional coupler 12, and sent to a transmission antenna 13 and a mixer 14.

The transmission antenna 13 radiates the high-frequency signal as a transmission wave ahead of the radar device. When an object exists ahead of the radar device, the high-frequency signal is reflected on the object, and the reflected wave which is time delayed is received as a reception wave by a reception antenna 15, and sent to the mixer 14.

The mixer 14 generates a signal (which will hereinafter be referred to as a beat signal) representing a difference between the frequency of the reflected wave and that of the transmission wave distributed by the directional coupler 12. This beat signal is amplified in an amplifier 16, thereafter digitized in a A/D converter 17, and processed in the microcomputer to calculate a relative distance between the radar device and an object and a relative velocity thereof with respect to the object.

When the desired D/A input data are generated, the microcomputer 10 uses the D/A converter 2 and voltmeter 4 to be operated in the same manner as that in the embodiment 1. The voltmeter 4 shown in FIG. 7 may be provided only when the FMCW radar device is tested and regulated, and may not be incorporated in the FMCW radar device.

Figure 8:
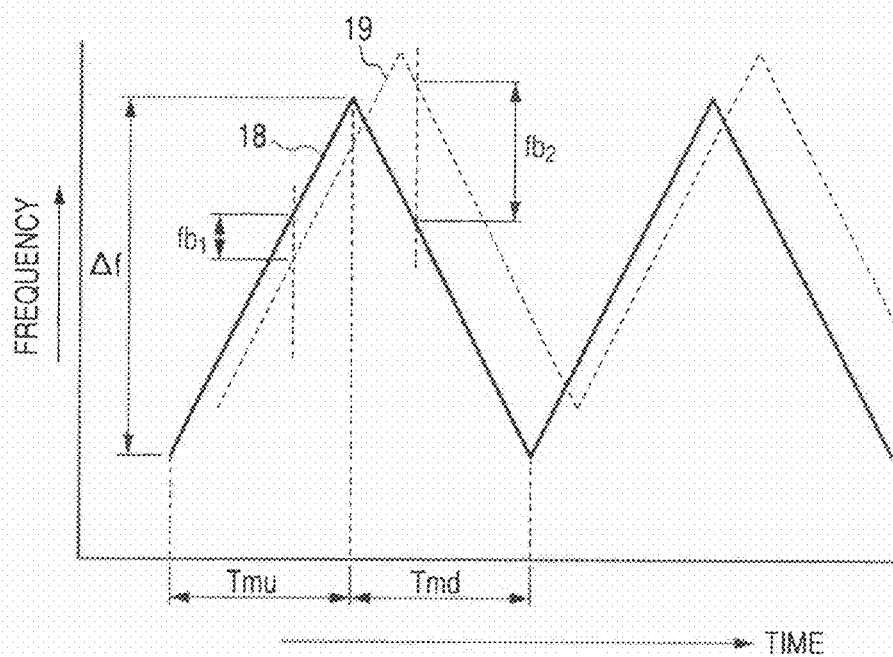
[FIG. 8] It is a frequency variation diagram used to calculate a relative distance between the radar device and an object and a relative velocity thereof showing the embodiment 4 of the present invention.

FIG. 8 shows a frequency variation diagram for calculating the relative distance between the radar device and an object, and the relative velocity thereof with respect to the object. In FIG. 8, the lateral axis represents time, and the longitudinal axis represents the frequency.

The transmission wave is radiated from the transmission antenna 13 so that its transmission frequency 18 is linearly increased in an UP Charp section Tmu, and linearly decreased in a DOWN Charp section Tmd.

Where V represents the relative velocity of the radar device with respect to the object, R the relative distance between the radar device and the object, C the velocity of light, λ transmission wavelength, Δf a frequency modulation width, and Tmu=Tmd=Tm, a Doppler frequency fd is expressed by the equation (2). A distance frequency fr which is proportional to the distance and occurs due to a time difference between a transmission frequency 18 and a reception frequency 19 is expressed by the equation (3), a beat frequency fb1 in the UP Charp section Tmu by the equation (4), and a beat frequency fb2 in the DOWN Charp section by the equation (5).

$$fd = 2 \cdot V/\lambda \quad (2)$$

$$fr = (2R \cdot \Delta f)/(C \cdot Tm) \quad (3)$$

$$fb1 = |fd - fr| \quad (4)$$

$$fb2 = |fd + fr| \quad (5)$$

When the distance frequency fr is larger than the Doppler frequency fd, the equation (6) is established.

$$2fr = fb1 + fb2 \quad (6)$$

When the equation (3) is substituted for the equation (6), the equation (7) which determines the relative distance R between the radar device and the object is lead out.

$$R(C \cdot Tm) \cdot (fb1 + fb2)/(4 \cdot \Delta f) \quad (7)$$

The distance between the radar device and the object can be determined by the beat frequency fb1 and beat frequency fb2 in the equation (7). When the distance frequency fr is calculated, the relative velocity can also be determined by the equations (2), (4) and (5).

Figure 9:
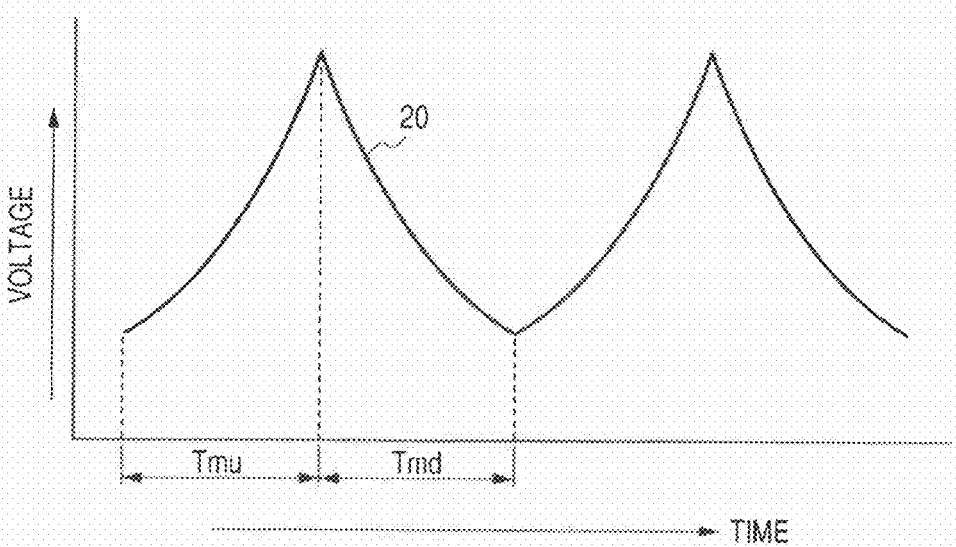
[FIG. 9] It is a waveform of a desired waveform signal showing the embodiment 4 of the present invention.

Here, the relation between a control voltage added to VCO of the FMCW radar device and an oscillation frequency is non-linear. Each VCO has an individual difference, so that it is necessary to add a control voltage to VCO in accordance with the characteristics thereof. FIG. 9 is a waveform diagram of a desired waveform 20 set in advance so as to correct the non-linearity mentioned above. Transmission frequency 18 is linearly increased or linearly decreased as mentioned above. However, since the transmission frequency has a non-linearity, a control voltage added to VCO does not become linear but becomes a high-order curve as shown by a desired waveform signal 20. The generation of desired D/A input data provided to the D/A converter 2 correspondingly to the desired waveform signal 20 can be carried out in the same manner as that for the desired waveform signal 6 in the embodiment 1.

The voltmeter 4 was described as a part connected to the D/A converter 2 and microcomputer 10. The voltmeter 4 may be provided so that the voltmeter be released from the D/A converter 2 and microcomputer 10 after the measurement of the D/A conversion voltage is measured during the generation of the desired D/A input data. The voltmeter 4 may be provided only when the D/A conversion voltage is measured, and may be removed from the FMCW radar device after the measurement finishes being conducted.

The voltmeter 4 may be made of an A/D converter.

The desired waveform signal 20 may be increased and decreased within the range, in which the DA converter 2 can practice the conversion operation, in the same manner as the desired waveform signal 6 in the embodiment 1. The number of bits of the D/A converter 2 may also be other than 8 bits at which the D/A conversion voltage is converted into 256 stages. An arbitrary D/A conversion voltage range may be set, for example, to a range having substantially equal to widths around V128 expressed as V128+−ΔV, or V100 to V200 etc.

Thus, according to this embodiment, a D/A-converted voltage in accordance with a desired voltage is generated on the basis of the D/A conversion data obtained by varying the input data into the D/A converter 2, by a minimum conversion unit or a unit obtained by multiplying the minimum conversion unit by an integer. It thereby becomes possible to generate a D/A conversion voltage in which an error occurring due to numeric irregularities of the D/A conversion element, such as a resistor etc. constituting the D/A converter 2 was corrected.

Since an error occurring due to numeric irregularities of the D/A conversion element, such as a resistor, etc. constituting the D/A converter 2 can be corrected, the accuracy of the oscillating frequency of VCO is improved, so that the measuring accuracy concerning a distance between the radar device and an object, or a relative velocity thereof with respect to the object can be improved.

Since an error occurring due to numeric irregularities of the D/A conversion element, such as a resistor, etc. constituting the D/A converter 2 can be corrected, it becomes possible to secure a necessary accuracy without employing a high bit number expensive D/A converter, and manufacture the radar device inexpensively.

It is a matter of course that the microcomputer 10, VCO 11, LPF 3 and D/A converter 2 be formed in a package separate from that for the transmission antenna 13 and reception antenna 15.

INDUSTRIAL APPLICABILITY

Thus, this invention can improve the accuracy of the waveform generated even when the D/A conversion element, such as a resistor constituting the D/A converter has numeric irregularities thereof Therefore, the invention is applied to a technical field of a waveform generation method and a radar device using a D/A converter.

What is claimed is:

1. Radar device comprising:
   a storage device for storing a timing at which a D/A-converted voltage in D/A conversion data obtained by varying input data into a D/A converter by a conversion unit level based on the D/A-converted voltage and a voltage of a desired waveform varying with time series become substantially equal to each other;
   a waveform storage device for registering the input data at the timing;
   a controller for giving the input data to the D/A converter at the timing; and
   a variable oscillator for varying an oscillation frequency in accordance with a variation of the D/A-converted voltage.

2. Radar device according to claim 1, wherein the desired waveform is set to a waveform which renders constant a rate of change of the oscillation frequency varying with time series.

3. An oscillator for radar device comprising:
   a time storage device for storing a timing in correspondence with input data in a D/A-converter at which a D/A conversion voltage in D/A conversion data obtained by varying the input data by a conversion unit level based on the D/A-converted voltage of a desired waveform varying with time series become substantially equal to each other;
   a controller for providing the input data to the D/A-converter at the timing; and
   a variable oscillator for varying an oscillation frequency in accordance with the variation of the D/A conversion voltage.

4. A waveform generation method comprising:
   feeding input data to a D/A-converter, wherein
      measuring of the input data is achieved as unit levels, and converting each unit level, via the D/A-converter, into a related output conversion voltage;
   determining an order of timing based on the output conversion voltage;
   associating the order of timing with a predetermined desired D/A input data; and
   adjusting the order of timing in accordance with the output conversion voltage to produce a desired waveform corresponding to the desired D/A input data.

5. The waveform generation method of claim 4, wherein the desired D/A input data is obtained by:
   connecting a voltage measuring device to a source of the output conversion voltage;
   measuring the output conversion voltage; and
   disconnecting the voltage measuring device from the source after obtaining measurement of the output conversion voltage.

* * * * *